(12) United States Patent
Otremba et al.

(10) Patent No.: US 10,373,897 B2
(45) Date of Patent: Aug. 6, 2019

(54) SEMICONDUCTOR DEVICES WITH IMPROVED THERMAL AND ELECTRICAL PERFORMANCE

(71) Applicant: Infineon Technologies Austria AG, Villach (AT)

(72) Inventors: Ralf Otremba, Kaufbeuren (DE); Felix Grawert, Villach (AT); Amirul Afiq Hud, Melaka (MY); Uwe Kirchner, Feldkirchen (AT); Teck Sim Lee, Melaka (MY); Guenther Lohmann, Sattendorf (AT); Hwee Yin Low, Melaka (MY); Edward Fuergut, Dasing (DE); Bernd Schmoelzer, Radenthein (AT); Fabian Schnoy, Tegernheim (DE); Franz Stueckler, St. Stefan (AT)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 76 days.

(21) Appl. No.: 15/376,756

(22) Filed: Dec. 13, 2016

(65) Prior Publication Data

US 2017/0179009 A1 Jun. 22, 2017

(30) Foreign Application Priority Data

Dec. 18, 2015 (DE) .................. 10 2015 122 259

(51) Int. Cl.
*H01L 23/49* (2006.01)
*H01L 23/495* (2006.01)
(Continued)

(52) U.S. Cl.
CPC .... *H01L 23/49568* (2013.01); *H01L 23/3121* (2013.01); *H01L 23/36* (2013.01);
(Continued)

(58) Field of Classification Search
CPC ......... H01L 23/49568; H01L 23/49575; H01L 23/3121; H01L 23/49558; H01L 23/49555;
(Continued)

(56) References Cited

U.S. PATENT DOCUMENTS 5,494,856 A * 2/1996 Beaumont .......... G01R 31/2863
228/180.22
5,729,440 A * 3/1998 Jimarez ................ B23K 1/0016
361/779
(Continued)

FOREIGN PATENT DOCUMENTS

CN 104112722 A 10/2014
DE 10251248 A1 10/2003
(Continued)

*Primary Examiner* — Charles D Garber
*Assistant Examiner* — S M Sohel Imtiaz
(74) *Attorney, Agent, or Firm* — Viering, Jentschura & Partner MBB

(57) ABSTRACT

A device may include a carrier, a semiconductor chip arranged over a first surface of the carrier, and an encapsulation body comprising six side surfaces and encapsulating the semiconductor chip. A second surface of the carrier opposite to the first surface of the carrier is exposed from the encapsulation body. The device may further include electrical contact elements electrically coupled to the semiconductor chip and protruding out of the encapsulation body exclusively through two opposing side surfaces of the encapsulation body which have the smallest surface areas of all the side surfaces of the encapsulation body, and an electrically insulating layer arranged over the exposed second surface of the carrier.

8 Claims, 8 Drawing Sheets

(51) Int. Cl.
*H01L 23/31* (2006.01)
*H01L 23/36* (2006.01)
*H01L 23/433* (2006.01)
*H01L 23/00* (2006.01)

(52) U.S. Cl.
CPC ...... *H01L 23/4334* (2013.01); *H01L 23/4952* (2013.01); *H01L 23/49503* (2013.01); *H01L 23/49524* (2013.01); *H01L 23/49551* (2013.01); *H01L 23/49555* (2013.01); *H01L 23/49558* (2013.01); *H01L 23/49575* (2013.01); *H01L 24/45* (2013.01); *H01L 24/48* (2013.01); *H01L 24/49* (2013.01); *H01L 2224/04042* (2013.01); *H01L 2224/40247* (2013.01); *H01L 2224/45015* (2013.01); *H01L 2224/45124* (2013.01); *H01L 2224/45147* (2013.01); *H01L 2224/48091* (2013.01); *H01L 2224/48247* (2013.01); *H01L 2224/4903* (2013.01); *H01L 2924/10272* (2013.01); *H01L 2924/13091* (2013.01); *H01L 2924/181* (2013.01); *H01L 2924/19107* (2013.01)

(58) Field of Classification Search
CPC ......... H01L 23/4952; H01L 2224/4903; H01L 2224/48247
See application file for complete search history.

(56) References Cited

U.S. PATENT DOCUMENTS

| | | | | |
|---|---|---|---|---|
| 5,806,181 A | * | 9/1998 | Khandros | H01R 43/16 29/840 |
| 6,130,479 A | * | 10/2000 | Chalco | H01L 24/11 257/734 |
| 6,162,838 A | * | 12/2000 | Kohl | H01L 21/02126 257/E21.26 |
| 2003/0213979 A1 | | 11/2003 | Nakajima et al. | |
| 2005/0093123 A1 | | 5/2005 | Yoshida et al. | |
| 2007/0075346 A1 | * | 4/2007 | Ho | H01L 33/44 257/296 |
| 2008/0191339 A1 | | 8/2008 | Otremba et al. | |
| 2011/0074018 A1 | * | 3/2011 | Fukuda | H01L 23/3128 257/737 |
| 2011/0089558 A1 | | 4/2011 | Muto et al. | |
| 2011/0241198 A1 | | 10/2011 | Azuma | |
| 2012/0292087 A1 | * | 11/2012 | Ueshima | H01L 23/3107 174/259 |
| 2012/0313230 A1 | * | 12/2012 | Mengel | H01L 24/29 257/676 |
| 2013/0027113 A1 | * | 1/2013 | Otremba | H01L 23/49524 327/423 |
| 2014/0312394 A1 | | 10/2014 | Mahler et al. | |
| 2014/0367860 A1 | * | 12/2014 | Im | H01L 23/34 257/774 |
| 2015/0028462 A1 | * | 1/2015 | Hasegawa | H01L 23/4334 257/675 |
| 2015/0187671 A1 | * | 7/2015 | Fukuda | H01L 23/12 257/773 |
| 2015/0187745 A1 | * | 7/2015 | Chiu | H01L 25/18 257/738 |

FOREIGN PATENT DOCUMENTS

| | | |
|---|---|---|
| DE | 102008008515 A1 | 9/2008 |
| JP | 2002270736 A | 9/2002 |

\* cited by examiner

SEMICONDUCTOR DEVICES WITH IMPROVED THERMAL AND ELECTRICAL PERFORMANCE

CROSS-REFERENCE TO RELATED APPLICATION

This application claims priority to German Patent Application Serial No. 10 2015 122259.0, which was filed Dec. 18, 2015, and is incorporated herein by reference in its entirety.

TECHNICAL FIELD

The disclosure relates to semiconductor devices in general. By way of example, the disclosure relates to aspects providing an improved thermal and electrical performance of semiconductor devices.

BACKGROUND

Semiconductor devices may include semiconductor chips, an encapsulation body and electrical contact elements that are electrically coupled to the semiconductor chips and protrude out of the encapsulation body. For example, a semiconductor device may be formed as a through-hole device wherein the electrical contact elements may be formed as contact pins to be inserted into through-hole sockets. Alternatively, a semiconductor device may be formed as a surface mount device wherein the electrical contact elements may have flat coplanar lower surfaces that may be attached to a contact surface. The design of the semiconductor devices may consider the occurrence of heat and electromagnetic interferences during an operation of the devices. Semiconductor devices constantly have to be improved. In particular, it may be desirable to improve a thermal and electrical performance of the semiconductor devices.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference signs may designate corresponding similar parts.

DESCRIPTION

Figure 1A:
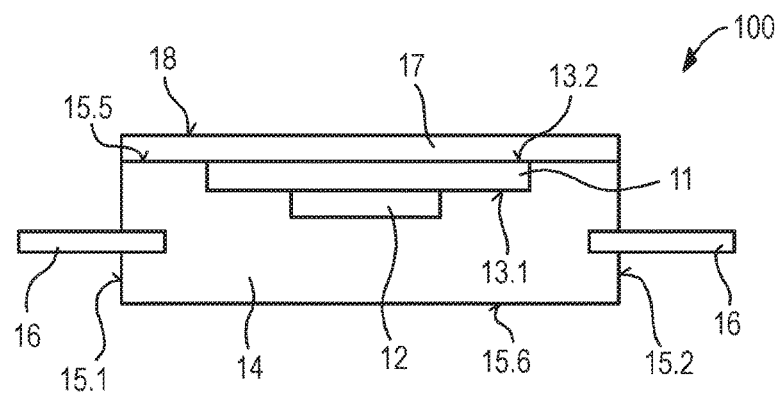
FIG. 1 includes FIG. 1A and FIG. 1B, wherein FIG. 1A schematically illustrates a top view of a device 100 in accordance with the disclosure
FIG. 1B illustrates a cross-sectional side view of the device 100.

In the following detailed description, reference is made to the accompanying drawings, in which are shown by way of illustration specific aspects in which the disclosure may be practiced. In this regard, directional terminology, such as "top", "bottom", "front", "back", "upper", "lower", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense, and the concepts of the present disclosure are defined by the appended claims.

As employed in this specification, the terms "connected", "coupled", "electrically connected" and/or "electrically coupled" may not necessarily mean that elements must be directly connected or coupled together. Intervening elements may be provided between the "connected", "coupled", "electrically connected" or "electrically coupled" elements.

Further, the word "over" used with regard to e.g. a material layer formed or located "over" a surface of an object may be used herein to mean that the material layer may be located (e.g. formed, deposited, etc.) "directly on", e.g. in direct contact with, the implied surface. The word "over" used with regard to e.g. a material layer formed or located "over" a surface may also be used herein to mean that the material layer may be located (e.g. formed, deposited, etc.) "indirectly on" the implied surface with e.g. one or more additional layers being arranged between the implied surface and the material layer.

Further, the words "perpendicular" and "parallel" may be used herein with regard to a relative orientation of two or more components. It is understood that these terms may not necessarily mean that the specified geometric relation is realized in a perfect geometric sense. Instead, fabrication tolerances of the involved components may need to be considered in this regard. For example, if two surfaces of an encapsulation material of a semiconductor package are specified to be perpendicular (or parallel) to each other, an actual angle between these surfaces may deviate from an exact value of 90 (or 0) degrees by a deviation value that may particularly depend on tolerances that may typically occur when applying techniques for fabricating a housing made of the encapsulation material.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures. In addition, the features of the various exemplary aspects described herein may be combined with each other, unless specifically noted otherwise.

The devices described herein may include one or more semiconductor chips that may be of different types and may be manufactured by different technologies. In general, the semiconductor chips may include integrated electrical, electrooptical or electromechanical circuits, passives, etc. In addition, the integrated circuits may generally be designed as logic integrated circuits, analog integrated circuits, mixed signal integrated circuits, power integrated circuits, memory circuits, integrated passives, microelectromechanical systems, etc. The semiconductor chips need not be manufactured from a specific semiconductor material. In one example, the semiconductor chips may be made of or may include an elemental semiconductor material, for example Si, etc. In a further example, the semiconductor chips may be made of or may include a compound semiconductor material, for example GaN, SiC, SiGe, GaAs, etc.

The semiconductor chips may particularly include one or more power semiconductors. In general, power semiconductor chips may be configured as diodes, power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), super junction devices, power bipolar transistors, etc.

The semiconductor chips may e.g. have a vertical structure, i.e. the semiconductor chips may be fabricated such that electrical currents may substantially flow in a direction perpendicular to the main faces of the semiconductor chips. A semiconductor chip having a vertical structure may have electrodes over its two main faces, i.e. over its top side and bottom side. In various aspects of this disclosure, power semiconductor chips may have a vertical structure and may have electrodes arranged over both main faces. In one example, the source electrode and gate electrode of a power MOSFET (Metal Oxide Semiconductor Field Effect Transistor) may be arranged over one face while the drain electrode of the power MOSFET may be arranged over the other face. In a further example, a power HEMT (High-Electron-Mobility Transistor), a PMOS (P-Channel Metal Oxide semiconductor), an NMOS (N-Channel Metal Oxide semiconductor), or one of the exemplary power semiconductors specified above may be configured as a vertical power semiconductor chip. The disclosure may also be applied to semiconductor chips having a lateral structure in which electrical currents may substantially flow in a direction parallel to a main face of the semiconductor chips. A semiconductor chip having a lateral structure may have electrodes arranged over only one of its main faces.

The semiconductor chips may be packaged. In this regard, the terms "semiconductor device" and "semiconductor package" as used herein may be interchangeably used. A semiconductor package may be a semiconductor device including an encapsulation material that may at least partly encapsulate one or more components of the semiconductor device.

The encapsulation material may be electrically insulating and may form an encapsulation body. The encapsulation material may include at least one of an epoxy, a glass fiber filled epoxy, a glass fiber filled polymer, an imide, a filled or non-filled thermoplastic polymer material, a filled or non-filled duroplastic polymer material, a filled or non-filled polymer blend, a thermosetting material, a mold compound, a glob-top material, a laminate material, etc. Various techniques may be used to encapsulate components of the device with the encapsulation material, for example at least one of compression molding, injection molding, powder molding, liquid molding, lamination, etc.

The encapsulation body may have the form of a rectangular cuboid formed by six side surfaces consisting of three pairs of opposite side surfaces. The side surfaces of a pair may have equal surface areas. The three surface areas of the three pairs may differ from each other or not. Two opposing side surfaces of the encapsulation body may have the smallest surface areas of all the side surfaces of the encapsulation body. The devices described herein may include electrical contact elements (e.g. leads, pins) electrically coupled to the semiconductor chips of the device and protruding out of the encapsulation body through the two opposing side surfaces of the encapsulation body having the smallest surface area.

The devices described herein may include a carrier over which one or more semiconductor chips may be arranged. The devices are not restricted to include a single carrier or a one-piece carrier, but may also include multiple subcarriers or a multi-piece carrier. A footprint of the carrier may e.g. depend on a number and footprints of semiconductor chips that are to be arranged over the carrier. Examples for carriers may be a diepad, a lead frame including a diepad, or a ceramic substrate including one or more redistribution layers.

In one example, a carrier may include a leadframe that may be structured such that diepads (or chip islands) and leads (or pins) may be formed. During a fabrication of a device, the diepads and the leads may be connected to each other. The diepads and the leads may also be made from one piece. The diepads and the leads may be connected among each other by connection means with the purpose of separating some of the diepads and the leads in the course of the fabrication. Here, separating the diepads and the leads may be carried out by at least one of mechanical sawing, a laser beam, cutting, stamping, milling, etching, etc.

In various aspects of this disclosure, a leadframe may be electrically conductive. For example, the leadframe may be entirely fabricated from metals and/or metal alloys, e.g. at least one of copper, copper alloys, nickel, iron nickel, aluminum, aluminum alloys, steel, stainless steel, etc. The leadframe material may include traces of iron, sulfur, iron nitride, etc. The leadframe may be plated with an electrically conductive material, for example at least one of copper, silver, palladium, gold, nickel, iron nickel, and nickel phosphorus. In this case, the leadframe may be referred to as "pre-plated leadframe". Even though a leadframe may be electrically conductive, an arbitrary selection of diepads of the leadframe may be electrically insulated from each other.

The carrier sections of a carrier may at least partly be covered by an encapsulation material of the device. A carrier section may be completely surrounded by an encapsulation material such that there are no surfaces of the carrier section accessible from outside of the encapsulation material. A further carrier section may be at least partly exposed from an encapsulation material such that there may be one or more exposed surfaces. For example, a surface of a diepad may be exposed from an encapsulation material such that an electrically insulating layer and/or a heatsink may be arranged over the exposed surface. During an operation of a corresponding device, heat generated by e.g. a semiconductor chip may be dissipated along a path that may extend from the semiconductor chip to the heatsink.

The devices described herein may include a plurality of electrical contact elements, for example a plurality of leads (or pins) that may be a part of a leadframe. The plurality of electrical contact elements may protrude out of an encapsulation material of the device such that an electrical connection between internal components of the device and external components may be established. In various aspects of this disclosure, the electrical contact elements may protrude out of the encapsulation body through two opposing side surfaces of the encapsulation body having the smallest surface areas of all the side surfaces of the encapsulation body. The leads may protrude out of the encapsulation body in parallel to each other. The distances (or lead pitches) between the individual leads may be similar or may differ from each other.

The devices described herein may include an electrically insulating layer that may be arranged over an exposed surface of a carrier. A thickness of the insulation layer may lie in a range from about 50 micrometer to about 500 micrometer, or in any of the subranges included in this range. The insulation material may be formed by applying at least one of etching, UV curing, vapor deposition, spin-on techniques, printing, photolithographic structuring, etc.

The electrically insulating layer may include a porous material. The porosity of a material may be regarded as a measure of the amount of empty spaces in the material, for example spaces filled with air. The porosity may be given as the percentage of the empty spaces with regard to the total volume of the insulation layer. The porosity of the insulation layer may be greater than 25%, e.g. greater than 50%, e.g. greater than 60%. The insulation layer may include at least one of silicon dioxide, fluorine-doped silicon dioxide, carbon-doped silicon dioxide, polymeric dielectric, nitride, metal oxide, etc.

The electrically insulating layer may satisfy specific conditions with regard to its dielectric constant $\varepsilon_r$ and its thermal conductivity $\lambda$. In one example, the dielectric constant $\varepsilon_r$ of the insulation layer may be lower than 3.5, e.g. lower than 3.0, e.g. lower than 2.0, e.g. lower than 1.5. In a further example, the dielectric constant $\varepsilon_r$ and the thermal conductivity $\lambda$ of the insulation layer may satisfy the relation $\lambda^{-1} \cdot \varepsilon_r < 4.0\ W^{-1} \cdot m \cdot K$, e.g. the relation $\lambda^{-1} \cdot \varepsilon_r < 3.5\ W^{-1} \cdot m \cdot K$, e.g. the relation $\lambda^{-1} \cdot \varepsilon_r < 3.0\ W^{-1} \cdot m \cdot K$, e.g. the relation $\lambda^{-1} \cdot \varepsilon_r < 2.0\ W^{-1} \cdot m \cdot K$, e.g. the relation $\lambda^{-1} \cdot \varepsilon_r < 1.0\ W^{-1} \cdot m \cdot K$. In yet a further example, the thermal conductivity $\lambda$ of the insulation layer may be greater than $0.7\ W^{-1} \cdot m \cdot K$, e.g. greater than $1.0\ W^{-1} \cdot m \cdot K$, e.g. greater than $1.3\ W^{-1} \cdot m \cdot K$.

The devices described herein may be configured to be mounted on a contact surface using a through hole technology or a surface mount technology. According to through hole technology (THT) the mounting of a THT device may involve the use of leads of the device that are inserted into holes (or through hole sockets) drilled in e.g. a PCB (Printed Circuit Board) and soldered to pads on the opposite side. According to surface mount technology (SMT) the device may be mounted or placed directly onto the surface of e.g. a PCB. A surface mount device (SMD) may include electrical contact elements that may be formed to have flat coplanar lower surfaces that may be attached to a contact surface of e.g. a PCB.

The devices described herein may include a first material that may be deposited over one or more of the electrical contact elements described above. The first material may be deposited over such electrical contact elements that are to be electrically coupled to a contact surface, for example a PCB. For example, the first material may include or may be made of at least one of tin and a tin alloy. A melting temperature of the first material may be smaller than a (maximum) temperature that may occur during a reflow soldering process. In this regard, the melting temperature of the first material may be smaller than about 260° C. so that the first material may melt during a reflow soldering process. The first material may provide good solder wettability. That is, the first material may be configured to provide adhesion to a solder material that may be applied to the first material, for example during a wave soldering process.

The devices described herein may include a second material that may be deposited over an exposed surface of a carrier. The second material may be different from the first material deposited over the one or more of the electrical contact elements.

In a first case, the second material may include or may be made of at least one of a metal and a metal alloy. The metal or metal alloy may have a melting temperature that may be greater than a (maximum) temperature that may occur during a reflow soldering process. In this regard, the melting temperature of the second material may be greater than about 260° C. so that the second material does not necessarily melt during a reflow soldering process while the first material deposited over the electrical contact elements may melt. The melting temperature of the second material may be greater than 300° C., 400° C., 500° C., 600° C., 700° C. or 800° C. In one example, the second material may include a layer of nickel and/or nickel phosphorus having a thickness in a range from about 1 micrometer to about 10 micrometers. Such Ni—NiP material may have a melting temperature of e.g. about 880° C. In a further example, the second material may include a layer of a precious metal, e.g. gold and/or silver, having a thickness in a range from about 0.5 micrometer to about 2 or 3 micrometers. A second material including a metal and/or metal alloy may particularly be used for SMD devices.

In a second case, the second material may be solder non-wettable. That is, the second material may be configured to remain exposed from a solder material that may be applied to the second material, for example during a wave soldering process. In a first example, a solder non-wettable material may include or may be made of a metal oxide. Here, the solder non-wettable material may e.g. include a layer of nickel oxide that may have a thickness in a range from about 10 nanometers to about 100 nanometers. In a further example, the solder non-wettable material may include a layer of aluminum oxide that may have a thickness in a range from about 1 nanometer to about 10 nanometers. In yet a further example, the solder non-wettable material may include a layer of copper oxide that may have a thickness in a range from about 80 nanometers to about 120 nanometers. A solder non-wettable metal oxide may particularly be deposited over the exposed surface of the carrier while an adjacent encapsulation material may remain free of the metal oxide. In a second example, a solder non-wettable material may include or may be made of an organic material. Here, the solder non-wettable material may e.g. include an imide layer that may have a thickness in a range from about 1 micrometer to about 10 micrometers. In a further example, the solder non-wettable material may include a nitride layer that may have a thickness in a range from about 10 nanometers to about 100 nanometers. An organic non-wettable material may particularly be deposited over the exposed surface of the carrier and may additionally cover an adjacent encapsulation material or not. A solder non-wettable material may be used for THT devices.

The second material may further provide one or more of the properties and purposes of the electrically insulating layer specified above. In one example, the second material may coincide with the electrically insulating layer.

Figure 1B:
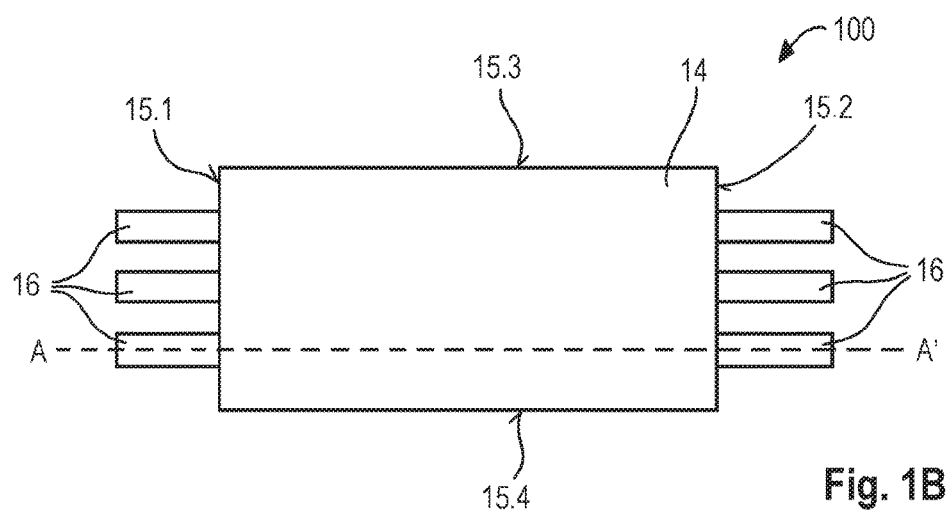

FIG. 1 includes FIG. 1A and FIG. 1B, wherein FIG. 1A schematically illustrates a cross-sectional side view of a device 100 in accordance with the disclosure. The cross-sectional side view of FIG. 1A is taken in a plane indicated by a line A-A' in a top view of the device 100 shown in FIG. 1B. In the example of FIG. 1, the device 100 is illustrated in a general manner and may include further components that are not illustrated for the sake of simplicity. For example, the device 100 may further include one or more components of other devices in accordance with the disclosure.

The device 100 may include a carrier 11 and a semiconductor chip 12 arranged over a first surface 13.1 of the carrier 11. For example, the carrier 11 may be a diepad of a leadframe and the semiconductor chip 12 may be a vertical power semiconductor chip. The device 100 may further include an encapsulation body 14 that may include six side surfaces 15.1 to 15.6. For example, the six side surfaces 15.1 to 15.6 may be arranged such that the encapsulation body 14 (or the device 100) has the form of a rectangular cuboid. The encapsulation body 14 may encapsulate the semiconductor chip 12. In addition, the encapsulation body 14 may at least partly cover the carrier 11. A second surface 13.2 of the carrier 11 opposite to the first surface 13.1 of the carrier 11 may be exposed from the encapsulation body 14. The device 100 may further include electrical contact elements 16 electrically coupled to the semiconductor chip 12 and protruding out of the encapsulation body 14 exclusively through two opposing side surfaces 15.1 and 15.2 of the encapsulation body 14. The two opposing side surfaces 15.1 and 15.2 may have the smallest surface areas of all the side surfaces 15.1 to 15.6 of the encapsulation body 14. For example, the electrical contact elements 16 may be a part of a leadframe. The device 100 may further include an electrically insulating layer 17 arranged over the exposed second surface 13.2 of the carrier 11.

The six side surfaces 15.1 to 15.6 of the device may include two opposing main surfaces 15.5 and 15.6 that may have the largest surface areas from all of the side surfaces 15.1 to 15.6. The semiconductor chip 12 may be particularly located within the encapsulation body 14 such that a main surface of the semiconductor chip 12 may be arranged in parallel to the two main surfaces 15.5 and 15.6. A main surface of the semiconductor chip 12 may include electrical contact elements of the semiconductor chip 12.

The second surface 13.2 of the carrier 11 and the main surface 15.5 of the encapsulation body 14 may be arranged in a common plane. In the example of FIG. 1, the complete second surface 13.2 of the carrier 11 may be exposed from the encapsulation body 14. However, in further examples, only a portion of the second surface 13.2 of the carrier 11 may exposed from the encapsulation body 14. The electrically insulating layer 17 may be in direct contact with the exposed part of the carrier 11. Here, a surface the electrically insulating layer 17 and at least one surface of the carrier 11 and the encapsulation body 14 may be arranged in a common plane. The electrically insulating layer 17 may be deposited over the entire main surface 15.5 of the encapsulation body 14 or only a part of it. The electrically insulating layer 17 may be deposited over the entire exposed part of the carrier 11.

The electrically insulating layer 17 may have any of the properties described above. For example, the electrically insulating layer 17 may include at least one of a silicon dioxide, a fluorine-doped silicon dioxide, a carbon-doped silicon dioxide, a polymeric dielectric, a nitride, a metal oxide. A thickness of the electrically insulating layer 17 may e.g. lie in a range from 50 micrometer to 500 micrometer. A surface 18 of the electrically insulating layer 17 facing away from the carrier 11 may be planar. The surface 18 may be exposed from a material such that the exposed surface 18 of the electrically insulating layer 17 may be configured to be coupled or attached to a heatsink (not illustrated). A main part of heat produced by the semiconductor chip 12 during an operation of the device 100 may be dissipated in a direction away from the semiconductor chip 12 towards an attached heatsink via the electrically insulating layer 17. Due to the chosen design of the device 100, it may be possible to spatially separate the directions of electrical paths and thermal paths from each other.

In the example of FIG. 1A, the electrical contact elements 16 protrude out of the encapsulation body 14 in a horizontal direction. However, the electrical contact elements 16 may also extend in additional directions. For example, the parts of the electrical contact elements 16 protruding out of the encapsulation body 14 in a horizontal direction may additionally be bent in a direction towards a mounting level of the device 100. In one embodiment, the electrical contact elements 16 may be bent in a way such that the device 100 may be configured to be mounted on a contact surface of e.g. a PCB using a through hole technology or a surface mount technology.

Figure 2:
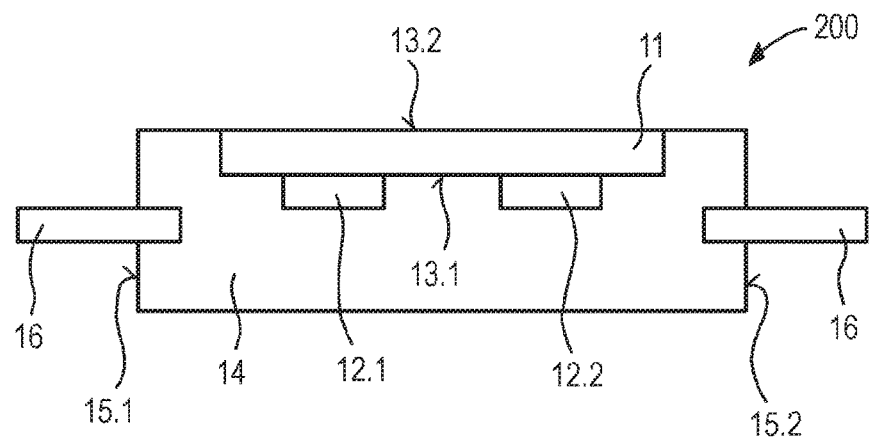
FIG. 2 schematically illustrates a cross-sectional side view of a device 200 in accordance with the disclosure.

FIG. 2 schematically illustrates a cross-sectional side view of a device 200 in accordance with the disclosure. The device 200 may be at least partly similar to the device 100 of FIG. 1 such that comments made in connection with FIG. 1 may also hold true for FIG. 2. For example, a top plan view of the device 200 may be similar to the top plan view of FIG. 1B. The device 200 may further include one or more components of other devices in accordance with the disclosure.

The device 200 may include a carrier 11 as well as a first semiconductor chip 12.1 and a second semiconductor chip 12.2 arranged over a first surface 13.1 of the carrier 11. In the example of FIG. 2, the semiconductor chips 12.1 and 12.2 are arranged over a single carrier 11. However, in further examples, the semiconductor chips 12.1 and 12.2 may also be arranged over multiple subcarriers. The device 200 may further include an encapsulation body 14 that may include six side surfaces 15.1 to 15.6 and encapsulate the first semiconductor chip 12.1 and the second semiconductor chip 12.2. A second surface 13.2 of the carrier 11 opposite to the first surface 13.1 of the carrier 11 may be exposed from the encapsulation body 14. The device 200 may further include electrical contact elements 16 that may be electrically coupled to at least one of the first semiconductor chip 12.1 and the second semiconductor chip 12.2. The electrical contact elements 16 may protrude out of the encapsulation body 14 exclusively through two opposing side surfaces 15.1 and 15.2 of the encapsulation body 14. The opposing side surfaces 15.1 and 15.2 may have the smallest surface areas of all the side surfaces 15.1 to 15.6 of the encapsulation body 14.

Figure 3:
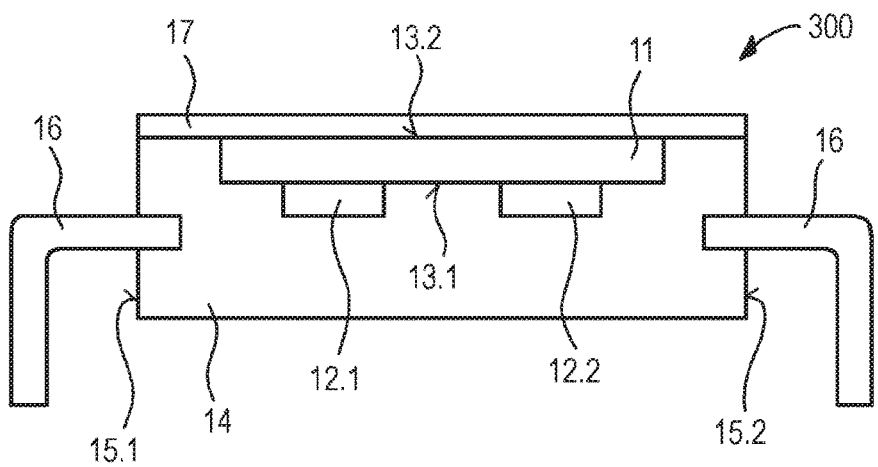
FIG. 3 schematically illustrates a cross-sectional side view of a device 300 in accordance with the disclosure.

FIG. 3 schematically illustrates a cross-sectional side view of a device 300 in accordance with the disclosure. The device 300 may be at least partly similar to the devices 100 and 200 such that comments made in connection with FIG. 1 and FIG. 2 may also hold true for FIG. 3. For example, a top plan view of the device 300 may be similar to the top plan view of FIG. 1B. The device 300 may further include one or more components of other devices in accordance with the disclosure.

The device 300 may include a carrier 11 and a first semiconductor chip 12.1 and a second semiconductor chip 12.2 arranged over a first surface 13.1 of the carrier 11. In the example of FIG. 3, the semiconductor chips 12.1 and 12.2 are arranged over a single carrier 11. However, in further examples, the semiconductor chips 12.1 and 12.2 may also be arranged over multiple subcarriers. The device 300 may further include an encapsulation body 14 that may include six side surfaces 15.1 to 15.6 and encapsulate the first semiconductor chip 12.1 and the second semiconductor chip 12.2. A second surface 13.2 of the carrier 11 opposite to the first surface 13.1 of the carrier 11 may be exposed from the encapsulation body 14. The device 300 may further include electrical contact elements 16 electrically coupled to the first semiconductor chip 12.1 and the second semiconductor chip 12.2 and protruding out of the encapsulation body 14 exclusively through two opposing side surfaces 15.1 and 15.2 of the encapsulation body 14. The two opposing side surfaces 15.1 and 15.2 may have the smallest surface areas of all the side surfaces 15.1 to 15.6 of the encapsulation body 14. The parts of the electrical contact elements 16 protruding out of the encapsulation body 14 may be bent in a direction towards a mounting level of the device 300. In this regard, the device 300 may be configured as a THT device or an SMD device, wherein the example of FIG. 3 may particularly represent a THT device. The device 300 may further include an electrically insulating layer 17 that may be arranged over the exposed second surface 13.2 of the carrier 11. The mounting level of the device 300 may be located opposite to the electrically insulating layer 17.

Figure 4A:
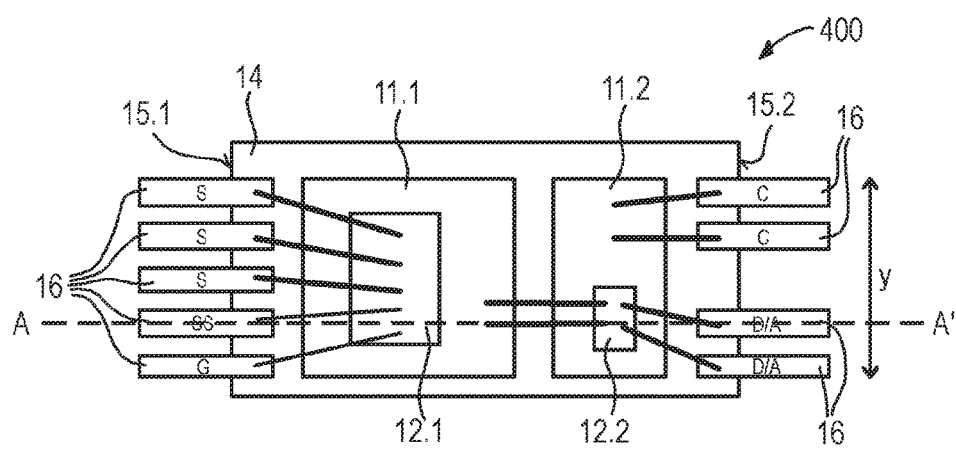
FIG. 4 includes FIG. 4A and FIG. 4B, wherein FIG. 4A schematically illustrates a top view of a device 400 in accordance with the disclosure
FIG. 4B illustrates a cross-sectional side view of the device 400.
Figure 4B:
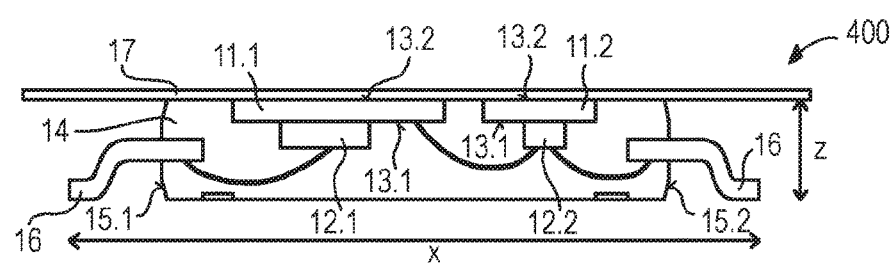

FIG. 4 includes FIG. 4A and FIG. 4B, wherein FIG. 4A schematically illustrates a top view of a device 400 in accordance with the disclosure and FIG. 4B illustrates a cross-sectional side view of the device 400 taken in a plane (see line A-A'). The device 400 may be seen as a more detailed implementation of the devices 100 to 300 such that details of the device 400 described below may be likewise applied to the devices 100 to 300.

The device 400 may include a leadframe that may have a first diepad 11.1 and a second diepad 11.2 which may be formed as separate parts. In addition, the leadframe may include electrical contact elements 16 in form of leads or pins. A first semiconductor chip 12.1 may be arranged over a first surface 13.1 of the first diepad 11.1, and a second semiconductor chip 12.2 may be arranged over a first surface 13.1 of the second diepad 11.2. The device 400 may further include an encapsulation body 14 that may at least partly cover the semiconductor chips 12.1, 12.2, the diepads 11.1, 11.2 and the leads 16. The device 400 may further include an electrically insulating layer 17 arranged over the diepads 11.1, 11.2 and the encapsulation body 14. The device 400 may further include multiple internal electrical connection elements that may have the form of wires in the example of FIG. 4. However, the wires in FIG. 4 may also be replaced by suitable other electrical connection elements, for example clips or a combination of wires and clips.

In the example of FIG. 4, the first semiconductor chip 12.1 may include a power transistor, for example a power MOSFET. The power MOSFET 12.1 may include a drain electrode that may face the first surface 13.1 of the first diepad 11.1 and may be electrically coupled to the first diepad 11.1. The power MOSFET 12.1 may further include a source electrode that may be arranged over a surface of the power MOSFET 12.1 facing away from the first diepad 11.1. The source electrode may be electrically coupled to three source leads "S" in the example of FIG. 4. However, further examples may include any other arbitrary number of source leads. In the example of FIG. 4, an electrical connection between the source electrode and the source leads "S" may be provided by wires (or bond wires). For example, the source wires may include at least one of aluminum and copper. A thickness of the source wires may lie in a range from about 240 micrometer to about 260 micrometer. The power MOSFET 12.1 may further include a gate electrode that may be arranged over the surface of the power MOSFET 12.1 facing away from the first diepad 11.1. The gate electrode may be electrically coupled to a gate lead "G". An electrical connection between the gate electrode and the gate lead "G" may be provided by a wire. A suitable gate wire may include at least one of aluminum and copper. A thickness of the gate wire may lie in a range from about 70 micrometer to about 80 micrometer. The power MOSFET 12.1 may further include a sensing signal electrode that may be arranged over the surface of the power MOSFET 12.1 facing away from the first diepad 11.1. The sensing signal electrode may be configured to provide a sensing signal that may be based on a physical parameter (or physical quantity or physical magnitude) of at least one of the semiconductor chips 12.1 and 12.2. In this regard, the sensing signal may e.g. represent a potential of a source electrode. The sensing signal electrode may be electrically coupled to a sensing signal lead "SS". An electrical connection between the sensing signal electrode and the sensing signal lead "SS" may be provided by a wire, wherein the sensing signal wire may be similar to the gate wire.

In the example of FIG. 4, the second semiconductor chip 12.2 may include a diode that may be made of a compound semiconductor material, for example silicon carbide. The diode 12.2 may include an anode electrode that may be arranged over a surface of the diode 12.2 facing away from the second diepad 11.2. The anode electrode may be electrically coupled to the first diepad 11.1 and thus to the drain electrode of the power MOSFET 12.1. In addition, the anode electrode may be electrically coupled to leads "(D)rain/(A) node". In the example of FIG. 4, an electrical connection between the anode electrode, the first diepad 11.1 and the D/A leads may be provided by wires that may be similar to the source wires described above. The diode 12.2 may further include a cathode electrode that may face the first surface 13.1 of the second diepad 11.2 and may be electrically coupled to the second diepad 11.2. The second diepad 11.2 and thus the cathode electrode may be electrically coupled to cathode leads "C". An electrical connection between the second diepad 11.2 and the cathode leads "C" may be provided by cathode wires which may be similar to the anode wires.

The design of the components and the electrical connections of the device 400 may be chosen such that the power MOSFET 12.1 and the diode 12.2 may be configured to operate as a power factor correction circuit.

Similar to foregoing examples, the encapsulation body 14 of the device 400 may include six side surfaces that may form a rectangular cuboid with side lengths denoted by "x", "y", "z". In a particular example, the side lengths (x; y; z) of the encapsulation body 14 may have the values (21 mm;

6.5 mm; 2.3 mm). In a further example, the side lengths (x; y; z) of the encapsulation body 14 may have the values (50 mm; 10 mm; 4.5 mm). In yet a further example, the side lengths (x; y; z) of the encapsulation body 14 may have the values (100 mm; 20 mm; 10 mm). In each of the given examples one or more of the values of the side lengths (x; y; z) may deviate up to about ±15%. The discussed dimensions of the device 400 may also apply to any of the other devices in accordance with the disclosure.

The leads 16 may protrude out of the encapsulation body 14 exclusively through two opposing side surfaces 15.1 and 15.2 of the encapsulation body 14 having the smallest surface areas of all the side surfaces of the encapsulation body 14. In the example of FIG. 4, the leads 16 may bent such that the device 400 may configured to be mounted on a contact surface using a surface mount technology. In this regard, the leads 16 may first extend out of the encapsulation body 14 in a horizontal direction and may then be bent in a way that their lower surfaces are coplanar so that the device 400 can be used as a surface mount device. In the example of FIG. 4, the leads 16 may have a first substantially horizontal part protruding out of the encapsulation body 14, a second (e.g. substantially vertical) part extending towards a mounting level of the device 400, and a third substantially horizontal part including the lower coplanar surfaces. The bending of the leads 16 may be smooth such that the leads 16 may not necessarily include sharp edges, but may rather have the form of a wing. In a further example, the leads 16 may be bent as illustrated in FIG. 3 such that the device 400 may be configured to be mounted on a contact surface using a through hole technology.

The device 400 may be mounted with its leads 16 on a customer's application, such as e.g. a PCB (not illustrated). As can be seen from FIG. 4, the leads 16 may be bent in a direction towards a possible PCB and away from the electrically insulating layer 17 and a possible heatsink (not illustrated) arranged thereon. Due to the design of the device 400, the heatsink and the PCB may thus be arranged on opposite main surfaces of the semiconductor package 400.

The second surfaces 13.2 of the diepads 11.1 and 11.2 may be exposed from the encapsulation body 14. The electrically insulating layer 17 may be arranged over the exposed part of the diepads 11.1 and 11.2. In the example of FIG. 4, the electrically insulating layer 17 may extend over the outline of the upper surface of the encapsulation body 14. In further examples, the surface area of the electrically insulating layer 17 may be equal or smaller than the surface area of the upper surface of the encapsulation body 14. The electrically insulating layer 17 is not restricted to be thermally coupled to only one device or semiconductor package, but may also extend over multiple exposed diepads of multiple semiconductor packages.

Figure 5A:
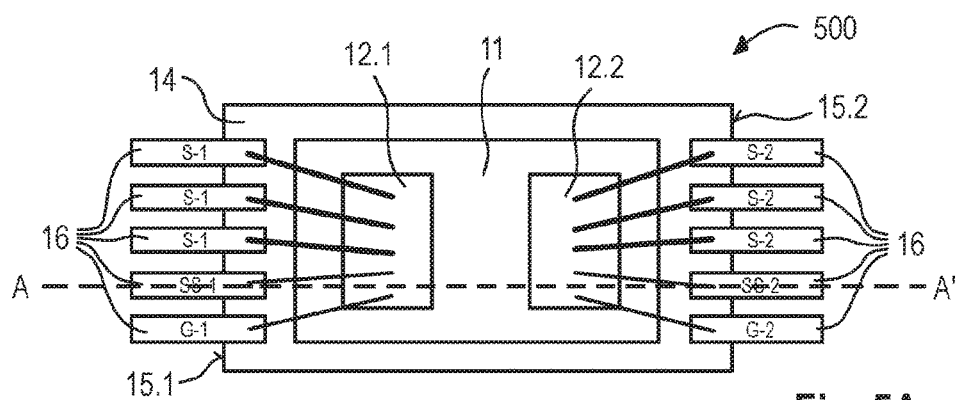
FIG. 5 includes FIG. 5A and FIG. 5B, wherein FIG. 5A schematically illustrates a top view of a device 500 in accordance with the disclosure
FIG. 5B illustrates a cross-sectional side view of the device 500.
Figure 5B:
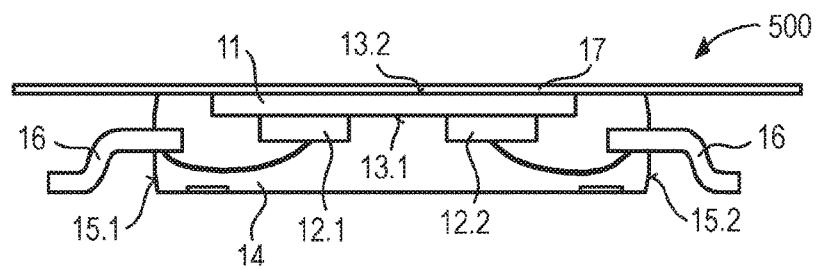

FIG. 5 includes FIG. 5A and FIG. 5B, wherein FIG. 5A schematically illustrates a top view of a device 500 in accordance with the disclosure and FIG. 5B illustrates a cross-sectional side view of the device 500 taken in a plane (see line A-A'). The device 500 may be seen as a more detailed implementation of the devices 100 to 300 such that details of the device 500 described below may be likewise applied to the devices 100 to 300.

The device 500 may include a leadframe that may have a diepad 11 and electrical contact elements 16 in form of leads or pins. The diepad 11 may be formed integrally as only one part, but further examples may also include additional diepads. A first semiconductor chip 12.1 and a second semiconductor chip 12.2 may be arranged over a first surface 13.1 of the diepad 11. The device 500 may further include an encapsulation body 14 that may at least partly cover the semiconductor chips 12.1 and 12.2, the diepad 11 and the leads 16. The device 500 may further include an electrically insulating layer 17 arranged over the diepad 11 and the encapsulation body 14. The device 500 may further include multiple internal electrical connection elements that may have the form of wires in the example of FIG. 5. However, the wires in FIG. 5 may also be replaced by suitable other electrical connection elements, for example clips or a combination of wires and clips.

In the example of FIG. 5, the first semiconductor chip 12.1 may include a first power transistor, for example a first power MOSFET. The first power MOSFET 12.1 may include a drain electrode that may face the first surface 13.1 of the diepad 11 and may be electrically coupled to the diepad 11. The first power MOSFET 12.1 may further include a source electrode, a gate electrode and a sensing signal electrode that may be arranged over a surface of the first power MOSFET 12.1 facing away from the diepad 11. An electrical connection between these electrodes and associated leads "S-1", "G-1" and "SS-1" may be provided by wires that may be similar to respective wires described in connection with FIG. 4. The leads "S-1", "G-1" and "SS-1" may be arranged at a first side surface 15.1 of the two opposing side surfaces 15.1 and 15.2 of the encapsulation body 14 having the smallest surface areas of all the side surfaces of the encapsulation body 14. The leads "S-1", "G-1" and "SS-1" may be electrically insulated from the diepad 11.

In the example of FIG. 5, the second semiconductor chip 12.2 may include a second power transistor, for example a second power MOSFET. The second power MOSFET 12.2 may be similar to the first power MOSFET 12.1 and may be arranged in a similar fashion. The electrodes of the second power MOSFET 12.2 may be electrically coupled to respective leads "S-2", "G-2" and "SS-2" that may be arranged at the second side surface 15.2 of the two opposing side surfaces 15.1 and 15.2 of the encapsulation body 14. The leads "S-2", "G-2" and "SS-2" may be electrically insulated from the diepad 11. The diepad 11 may electrically couple the first power MOSFET 12.1 and the second power MOSFET 12.2. The drain electrode of the first power MOSFET 12.1 and the drain electrode of the second power MOSFET 12.2 may be electrically coupled via the diepad 11.

The encapsulation body 14, the leads 16 and the electrically insulating layer 17 of the device 500 may be similar to corresponding components of the device 400 shown in FIG. 4 such that comments made in connection with FIG. 4 may also hold true for FIG. 5.

The design of the components and the electrical connections of the device 500 may be chosen such that the first power MOSFET 12.1 and the second power MOSFET 12.2 may be configured to operate as a biswitch circuit.

Figure 6A:
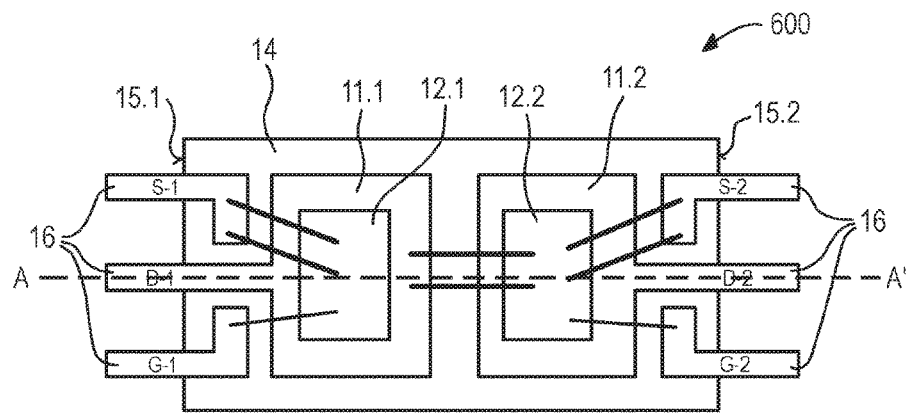
FIG. 6 includes FIG. 6A and FIG. 6B, wherein FIG. 6A schematically illustrates a top view of a device 600 in accordance with the disclosure
FIG. 6B illustrates a cross-sectional side view of the device 600.
Figure 6B:
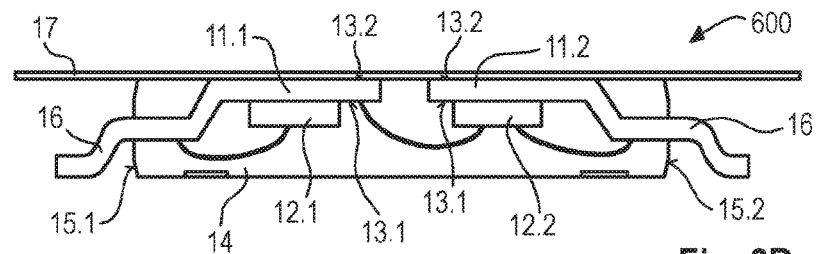

FIG. 6 includes FIG. 6A and FIG. 6B, wherein FIG. 6A schematically illustrates a top view of a device 600 in accordance with the disclosure and FIG. 6B illustrates a cross-sectional side view of the device 600 taken in a plane (see line A-A'). The device 600 may be seen as a more detailed implementation of the devices 100 to 300 such that details of the device 600 described below may be likewise applied to the devices 100 to 300.

The device 600 may include a leadframe that may have a first diepad 11.1 and a second diepad 11.2. In the example of FIG. 6, the diepads 11.1 and 11.2 may be formed as separate parts. In addition, the leadframe may include electrical contact elements 16 in form of leads or pins. A first semiconductor chip 12.1 may be arranged over a first surface 13.1 of the first diepad 11.1, and a second semiconductor chip 12.2 may be arranged over a first surface 13.1 of the second diepad 11.2. The device 600 may further include an encapsulation body 14 that may at least partly cover the semiconductor chips 12.1, 12.2, the diepads 11.1, 11.2 and the leads 16. The device 600 may further include an electrically insulating layer 17 arranged over the encapsulation body 14. In the example of FIG. 6, multiple internal electrical connection elements that may have the form of wires may be arranged in the device 600. However, the wires in FIG. 6 may also be replaced by suitable other electrical connection elements, for example clips or a combination of wires and clips.

In the example of FIG. 6, the first semiconductor chip 12.1 may include a first power transistor, for example a first power MOSFET. The first power MOSFET 12.1 may include a drain electrode that may face the first surface 13.1 of the first diepad 11.1 and may be electrically coupled to the first diepad 11.1. In addition, the first power MOSFET 12.1 may include a gate electrode and a source electrode that may be arranged over a surface of the first power MOSFET 12.1 facing away from the first diepad 11.1. The electrodes of the first power MOSFET 12.1 may be electrically coupled to respective leads "G-1", "S-1 and "D-1". The leads "G-1" and "S-1" may be electrically insulated from the first diepad 11.1 while the lead "D-1" may be formed integrally with the first diepad 11.1 and thus may be electrically coupled to the diepad 11.1. In the example of FIG. 6, an electrical connection between the source electrode and the source lead "S-1" may be provided by wires. For example, the wires may include at least one of aluminum and copper. A thickness of the source wires may lie in a range from about 340 micrometer to about 360 micrometer. An electrical connection between the gate electrode and the gate lead "G-1" may be provided by a wire that may be similar to the gate wire of the device 400.

In the example of FIG. 6, the second semiconductor chip 12.2 may include a second power transistor, for example a second power MOSFET. The second power MOSFET 12.2 may be similar to the first power MOSFET 12.1 and may be arranged in a similar fashion. The electrodes of the second power MOSFET 12.2 may be electrically coupled to respective leads "G-2", "S-2" and "D-2". In addition, the source electrode of the second power MOSFET 12.2 may be electrically coupled to the first diepad 11.1 and thus to the drain electrode of the first power MOSFET 12.1 via wires that may be similar to the source wires.

The encapsulation body 14, the leads 16 and the electrically insulating layer 17 of the device 600 may be similar to corresponding components of the devices 400 and 500 shown in FIG. 4 and FIG. 5 such that comments made in connection with FIG. 4 and FIG. 5 may also hold true for FIG. 6.

The design of the components and the electrical connections of the device 600 may be chosen such that the first power MOSFET 12.1 and the second power MOSFET 12.2 may be configured to operate as a half bridge circuit. Here, each of the first power MOSFET 12.1 and the second power MOSFET 12.2 may operate as switch of the half bridge circuit.

Figure 7:
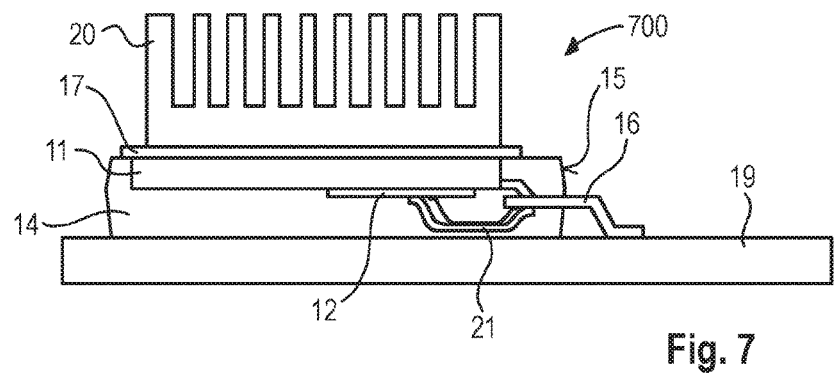
FIG. 7 schematically illustrates a cross-sectional side view of a device 700 in accordance with the disclosure.

FIG. 7 schematically illustrates a cross-sectional side view of a device 700 in accordance with the disclosure. The device 700 may include a leadframe that may include a diepad 11 and a plurality of leads 16. A semiconductor chip 12 may be arranged over the diepad 11 and may be electrically coupled to the leads 16 via electrical connection elements 21. The device 700 may further include an encapsulation body 14 that may at least partly cover the semiconductor chip 12, the diepad 11 and the leads 16. In addition, the device 700 may include an electrically insulating layer 17 arranged over the diepad 11 and the encapsulation body 14. The device 700 may be mounted on a PCB 19 and a heatsink 20 may be attached to the device 700. The PCB 19 and/or the heatsink 20 may be seen as a part of the device 700 or not.

In the example of FIG. 7, the semiconductor chip 12 may include a power transistor, for example a power MOSFET. The power MOSFET 12 may include a drain electrode that may face the diepad 11 as well as a gate electrode and a source electrode that may be arranged over a surface of the power MOSFET 12 facing away from the diepad 11. The electrodes of the power MOSFET 12 may be electrically coupled to respective leads 16 that may protrude out of the encapsulation body 14 exclusively through a side surface 15 of the encapsulation body 14 having the smallest surface area of all the side surfaces of the encapsulation body 14. In this regard, the encapsulation body 14 may be shaped similar to previously described examples. In the example of FIG. 7, the leads 16 protrude out of the right side surface 15 of the encapsulation body 14 and may be formed similar to the leads 16 of FIG. 4 to FIG. 6 such that the device 700 may be mounted to the PCB 19 using a surface mount technology. In a further example, the leads 16 may e.g. be formed as shown in FIG. 3 such that the device 700 may be configured to be mounted to the PCB 19 using a through hole technology.

Figure 8:
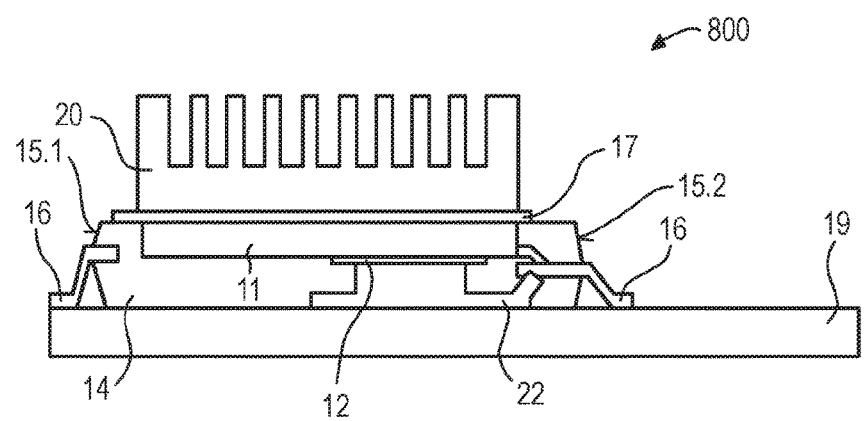
FIG. 8 schematically illustrates a cross-sectional side view of a device 800 in accordance with the disclosure.

FIG. 8 schematically illustrates a cross-sectional side view of a device 800 in accordance with the disclosure. The device 800 may at least partly be similar to the device 700 of FIG. 7 and may include similar components. The devices 700 and 800 may include a similar circuitry and thus may be configured to operate in a similar fashion.

For example, the device 800 may differ from the device 700 of FIG. 7 as follows. First, the leads 16 may protrude out of the encapsulation body 14 through two opposing side surfaces 15.1 and 15.2 of the encapsulation body 14 which have the smallest surface areas of all the side surfaces of the encapsulation body 14. Second, at least one of the internal electrical connections is not provided by wires, but instead by means of one or more clips 22. Besides a dissipation of heat produced by the semiconductor chip 12 in a direction towards the heatsink 20, the heat may also be dissipated via the clip(s) 22 in a direction towards the PCB 19.

Figure 9:
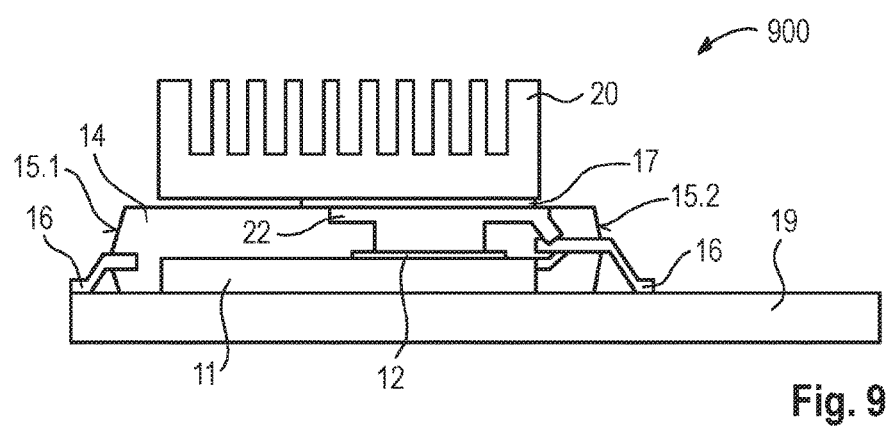
FIG. 9 schematically illustrates a cross-sectional side view of a device 900 in accordance with the disclosure.

FIG. 9 schematically illustrates a cross-sectional side view of a device 900 in accordance with the disclosure. The device 900 may at least partly be similar to the device 800 of FIG. 8 and may include similar components. The devices 800 and 900 may include a similar circuitry and thus may be configured to operate in a similar fashion.

For example, the device 900 may differ from the device 800 of FIG. 8 as follows. First, compared to FIG. 8, the positions of the clip 22 and the diepad 11 may be interchanged. That is, the diepad 11 may be arranged at the lower side of the encapsulation body 14 facing the PCB 19, and the clip 22 may be arranged at the upper side of the encapsulation body 14 facing the heatsink 20. Second, in FIG. 9, the electrically insulating layer 17 may be arranged over an exposed part of the clip 22, instead of over an exposed part of the diepad 11 as in FIG. 8. In one example, the electrically insulating layer 17 may entirely cover the exposed part of the clip 22. Similar to FIG. 8, heat produced by the semiconductor chip 12 may be dissipated in an upward and in a downward direction.

Figure 10:
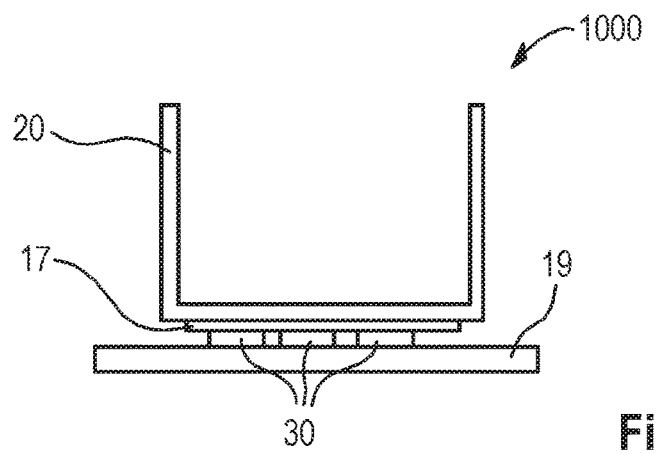
FIG. 10 schematically illustrates a cross-sectional side view of a cooling concept 1000 for a device in accordance with the disclosure.
Figure 11:
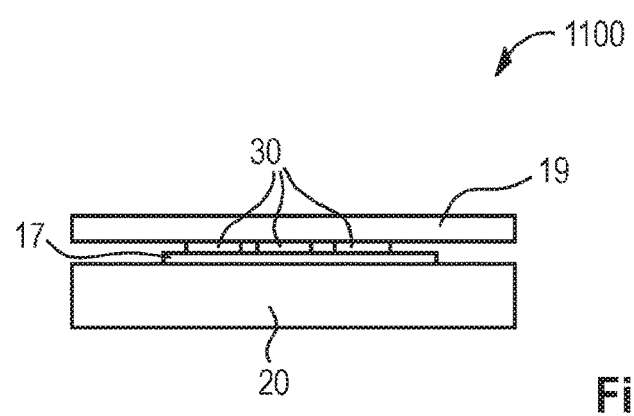
FIG. 11 schematically illustrates a cross-sectional side view of a cooling concept 1100 for a device in accordance with the disclosure.
Figure 12:
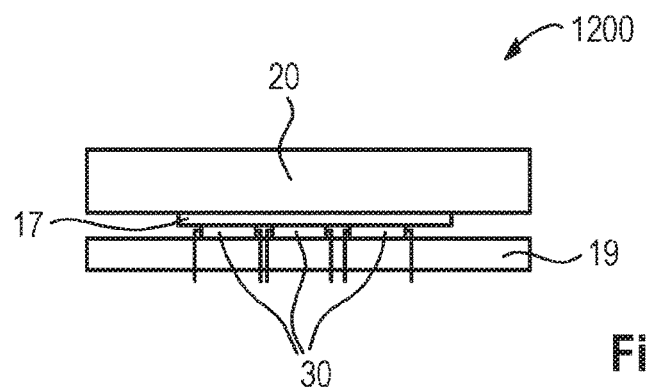
FIG. 12 schematically illustrates a cross-sectional side view of a cooling concept 1200 for a device in accordance with the disclosure.

FIG. 10 to FIG. 12 schematically illustrate cross-sectional side views of cooling concepts 1000 to 1200 that may be applied to devices in accordance with the disclosure.

The cooling concept 1000 of FIG. 10 may include multiple devices 30 each of which may be similar to any of the devices in accordance with the disclosure described herein. The devices 30 may be mounted over the upper surface of a PCB 19, for example by using a surface mount technology. In addition, an electrically insulating layer 17 may be arranged over the upper surfaces of the devices 30 in a way as previously described. A U-shaped heatsink 20 may be arranged over the upper surface of the electrically insulating layer 17. For example, the cooling concept 1000 may be applied in the field of telecommunications.

The cooling concept 1100 of FIG. 11 may include multiple devices 30 each of which may be similar to any of the devices in accordance with the disclosure described herein. The devices 30 may be mounted over the lower surface of a PCB 19, for example by using a surface mount technology. Further, an electrically insulating layer 17 may be arranged over the lower surfaces of the devices 30 in a way as previously described. A heatsink 20 may be arranged over the lower surface of the electrically insulating layer 17. For example, the cooling concept 1100 may be applied in the field of telecommunications or automotive electronics. In automotive electronics, the heatsink 20 may e.g. be a part of a chassis.

The cooling concept 1200 of FIG. 12 may include multiple devices 30 each of which may be similar to any of the devices in accordance with the disclosure described herein. The devices 30 may be mounted over the upper surface of a PCB 19, for example by using a through hole technology. Further, an electrically insulating layer 17 may be arranged over the upper surfaces of the devices 30 in a way as previously described. A heatsink 20 may be arranged over the upper surface of the electrically insulating layer 17. For example, the cooling concept 1200 may be applied in the field of consumer electronics.

Figure 13:
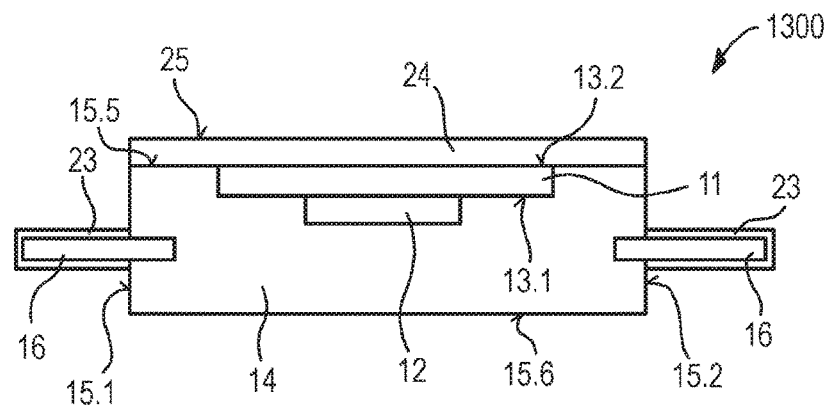
FIG. 13 schematically illustrates a cross-sectional side view of a device 1300 in accordance with the disclosure.

FIG. 13 schematically illustrates a cross-sectional side view of a device 1300 in accordance with the disclosure. The device 1300 may further include one or more components of other devices in accordance with the disclosure. A top plan view of the device 1300 may be similar to the top plan view of the device 100 in FIG. 1B.

The device 1300 may include a carrier 11 and a semiconductor chip 12 arranged over a first surface 13.1 of the carrier 11. The device 1300 may further include an encapsulation body 14 that may include six side surfaces 15.1 to 15.6 and may encapsulate the semiconductor chip 12. Possible forms of the encapsulation body 14 have been described above. A second surface 13.2 of the carrier 11 opposite to the first surface 13.1 of the carrier 11 may be exposed from the encapsulation body 14. The device 1300 may further include electrical contact elements 16 electrically coupled to the semiconductor chip 12 and protruding out of the encapsulation body 14 exclusively through two opposing side surfaces 15.1 and 15.2 of the encapsulation body 14 which have the smallest surface areas of all the side surfaces 15.1 to 15.6 of the encapsulation body 14. The device 1300 may further include a first material 23 deposited over at least one of the electrical contact elements 16. The device 1300 may further include a second material 24 that may be different from the first material 23 and may be deposited over the exposed second surface 13.2 of the carrier 11.

The device 1300 may be at least partly similar to the device 100 of FIG. 1 such that comments made in connection with FIG. 1 may also hold true for the device 1300. Compared to FIG. 1, the device 1300 may not necessarily include the electrically insulating layer 17, but may include the first material 23 and second material 24.

The first material 23 may include at least one of tin and a tin alloy. The first material 23 may be deposited over such electrical contact elements 16 that are to be electrically coupled to a contact surface, for example a PCB (not illustrated). In the example of FIG. 13, the first material 23 may be deposited over the entire surface of the electrical contact elements 16. However, in further examples, the first material 23 may be deposited over only selected parts of the electrical contact elements 16, for example an upper surface and/or a lower surface of the electrical contact elements 16.

The second material 24 may be configured to protect the top side of the device 1300, and e.g. to protect the exposed second surface 13.2 of the carrier 11. In the example of FIG. 13, the second material 24 may cover the entire upper surface of the device 1300, i.e. the exposed second surface 13.2 of the carrier 11 as well as the upper main surface 15.5 of the encapsulation body 14. However, in further examples, the second material 24 may only cover the exposed second surface 13.2 of the carrier 11 and optionally parts of the upper main surface 15.5 of the encapsulation body 14. In a first example, the second material 24 may be solder non-wettable so that the exposed second surface 13.2 of the carrier 11 may remain free from a solder material that may e.g. be applied in a wave soldering process. In a second example, the second material 24 may have a melting temperature that may be greater than a (maximum) temperature that may occur during a reflow soldering process so that the second material 24 may not necessarily melt during a reflow soldering process.

The device 1300 may further include a heatsink (not illustrated) that may be arranged over a surface 25 of the second material 24 facing away from the carrier 11. Here, optional thermal grease may be provided between the second material 24 and the heatsink. Conventional devices that may differ from the device 1300 may not necessarily include the second material 24, but a tin layer arranged over the exposed second surface 13.2 of the carrier 11. The tin layer may melt during e.g. a reflow soldering process, wherein the melted tin layer may provide an uneven surface over which the heatsink is to be mounted. This may lead to a gap along the interface between the upper surface of the device and the heatsink mounted thereon so that a thermal dissipation of occurring heat may be reduced. Due to the arrangement of the second material 24 in accordance with the disclosure, the exposed second surface 13.2 of the carrier 11 may remain free of any tin or solder. Accordingly, no gap may occur between the upper surface of the device 1300 and a heatsink mounted thereon so that an increased thermal dissipation of produced heat may be obtained.

Figure 14:
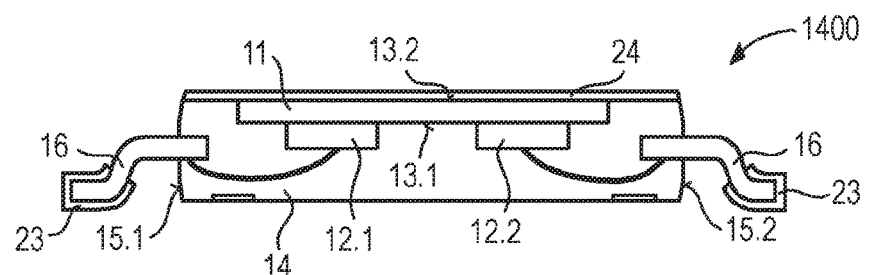
FIG. 14 schematically illustrates a cross-sectional side view of a device 1400 in accordance with the disclosure.

In further examples, the first material 23 and the second material 24 may be used in devices that may be similar to any of the devices in FIG. 1 to FIG. 12. By way of example, FIG. 14 schematically illustrates a cross-sectional side view of a device 1400 in accordance with the disclosure which is similar to the device 500 of FIG. 5 and includes the first material 23 and the second material 24. Comments made in connection with FIG. 5 and FIG. 13 may thus also hold true for the device 1400.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the term "exemplary" is merely meant as an example, rather than the best or optimal. It is also to be appreciated that features and/or elements depicted herein are illustrated with particular dimensions relative to each other for purposes of simplicity and ease of understanding and that actual dimensions may differ substantially from that illustrated herein.

Although specific aspects have been illustrated and described herein, it will be appreciated by those of ordinary skill in the art that a variety of alternate and/or equivalent implementations may be substituted for the specific aspects shown and described without departing from the concept of the disclosure. This application is intended to cover any adaptations or variations of the specific aspects discussed herein. Therefore, it is intended that this disclosure be limited only by the claims and the equivalents thereof.

What is claimed is:

1. A device, comprising:
   a carrier;
   a semiconductor chip arranged over a first surface of the carrier;
   an encapsulation body comprising six side surfaces and encapsulating the semiconductor chip, wherein a second surface of the carrier opposite to the first surface of the carrier is exposed from the encapsulation body;
   electrical contact elements electrically coupled to the semiconductor chip and protruding out of the encapsulation body exclusively through two opposing side surfaces of the encapsulation body which have the smallest surface areas of all the side surfaces of the encapsulation body;
   a first material deposited over one or more of the electrical contact elements;
   and a second material deposited over the exposed second surface of the carrier;
   and wherein the first material is a solder-wettable material, and wherein the second material is a solder non-wettable material.

2. The device of claim 1, wherein the electrically insulating layer comprises at least one of a silicon dioxide, a fluorine-doped silicon dioxide, a carbon-doped silicon dioxide, a polymeric dielectric, a nitride, a metal oxide.

3. The device of claim 1, wherein the electrically insulating layer has a thickness in a range from 50 micrometer to 500 micrometer.

4. The device of claim 1, wherein the carrier comprises a diepad of a leadframe and the electrical contact elements comprise leads of the leadframe.

5. The device of claim 1, wherein the parts of the electrical contact elements protruding out of the encapsulation body are bent in a direction towards a mounting level of the device.

6. The device of claim 1, wherein the device is configured to be mounted on a contact surface using a surface mount technology or a through hole technology.

7. The device of claim 1, wherein the first material has a melting temperature of less than 260 degrees Celsius.

8. The device of claim 7, wherein the second material has a melting temperature of at least 260 degrees Celsius.

* * * * *